(12) United States Patent
Papaefthymiou et al.

(10) Patent No.: US 8,368,450 B2
(45) Date of Patent: Feb. 5, 2013

(54) ARCHITECTURE FOR ADJUSTING NATURAL FREQUENCY IN RESONANT CLOCK DISTRIBUTION NETWORKS

(75) Inventors: Marios C. Papaefthymiou, Ann Arbor, MI (US); Alexander Ishii, Princeton, NJ (US)

(73) Assignee: Cyclos Semiconductor, Inc., Berkeley, CA (US)

( * ) Notice: Subject to any disclaimer, the term of this patent is extended or adjusted under 35 U.S.C. 154(b) by 0 days.

(21) Appl. No.: 12/903,166

(22) Filed: Oct. 12, 2010

(65) Prior Publication Data

US 2011/0090018 A1 Apr. 21, 2011

Related U.S. Application Data

(60) Provisional application No. 61/250,830, filed on Oct. 12, 2009.

(51) Int. Cl.
*G06F 1/04* (2006.01)
(52) U.S. Cl. .......................................... 327/291; 327/344
(58) Field of Classification Search .................. None
See application file for complete search history.

(56) References Cited

U.S. PATENT DOCUMENTS

| | | | |
|---|---|---|---|
| 4,611,135 A | 9/1986 | Nakayama et al. |
| 5,023,480 A | 6/1991 | Gieseke et al. |
| 5,036,217 A | 7/1991 | Rollins et al. |
| 5,111,072 A | 5/1992 | Seidel |
| 5,122,679 A | 6/1992 | Ishii et al. |
| 5,146,109 A | 9/1992 | Martignoni et al. |
| 5,311,071 A | 5/1994 | Ueda |
| 5,332,916 A | 7/1994 | Hirai |
| 5,384,493 A | 1/1995 | Furuki |
| 5,396,527 A | 3/1995 | Schlecht et al. |
| 5,410,491 A | 4/1995 | Minami |
| 5,430,408 A | 7/1995 | Ovens et al. |
| 5,473,526 A | 12/1995 | Svensson et al. |
| 5,489,866 A | 2/1996 | Diba |
| 5,504,441 A | 4/1996 | Sigal |
| 5,506,520 A | 4/1996 | Frank et al. |
| 5,506,528 A | 4/1996 | Cao et al. |
| 5,508,639 A | 4/1996 | Fattaruso |
| 5,517,145 A | 5/1996 | Frank |
| 5,517,399 A | 5/1996 | Yamauchi et al. |

(Continued)

FOREIGN PATENT DOCUMENTS

| | | |
|---|---|---|
| EP | 0953892 | 11/1999 |
| EP | 1126612 | 8/2001 |

(Continued)

OTHER PUBLICATIONS

International Search Report and Written Opinion issued in PCT/US2010/052396 on Jun. 23, 2011.

(Continued)

*Primary Examiner* — An Luu
(74) *Attorney, Agent, or Firm* — Sheppard, Mullin, Richter & Hampton LLP

(57) ABSTRACT

An inductor architecture for resonant clock distribution networks is proposed. This architecture allows for the adjustment of the natural frequency of a resonant clock distribution network, so that it achieves energy-efficient operation at multiple clock frequencies. The proposed architecture is primarily targeted at the design of integrated inductors and exhibits relatively low area overheads. Such an architecture is generally applicable to semiconductor devices with multiple clock frequencies, and high-performance and low-power clocking requirements such as microprocessors, ASICs, and SOCs. Moreover, it is applicable to the binning of semiconductor devices according to achievable performance levels.

13 Claims, 8 Drawing Sheets

U.S. PATENT DOCUMENTS

| | | | |
|---|---|---|---|
| 5,526,319 | A | 6/1996 | Dennard et al. |
| 5,537,067 | A | 7/1996 | Carvajal et al. |
| 5,559,463 | A | 9/1996 | Denker et al. |
| 5,559,478 | A | 9/1996 | Athas et al. |
| 5,587,676 | A | 12/1996 | Chowdhury |
| 5,675,263 | A | 10/1997 | Gabara |
| 5,701,093 | A | 12/1997 | Suzuki |
| 5,734,285 | A | 3/1998 | Harvey |
| 5,760,620 | A | 6/1998 | Doluca |
| 5,838,203 | A | 11/1998 | Stamoulis et al. |
| 5,841,299 | A | 11/1998 | De |
| 5,872,489 | A * | 2/1999 | Chang et al. .......... 331/179 |
| 5,892,387 | A | 4/1999 | Shigehara et al. |
| 5,896,054 | A | 4/1999 | Gonzalez |
| 5,970,074 | A | 10/1999 | Ehiro |
| 5,986,476 | A | 11/1999 | De |
| 5,999,025 | A | 12/1999 | New |
| 6,009,021 | A | 12/1999 | Kioi |
| 6,009,531 | A | 12/1999 | Selvidge et al. |
| 6,011,441 | A | 1/2000 | Ghoshal |
| 6,037,816 | A | 3/2000 | Yamauchi |
| 6,052,019 | A | 4/2000 | Kwong |
| 6,069,495 | A | 5/2000 | Ciccone et al. |
| 6,091,629 | A | 7/2000 | Osada et al. |
| 6,150,865 | A | 11/2000 | Fluxman et al. |
| 6,160,422 | A | 12/2000 | Huang |
| 6,169,443 | B1 | 1/2001 | Shigehara et al. |
| 6,177,819 | B1 | 1/2001 | Nguyen |
| 6,230,300 | B1 | 5/2001 | Takano |
| 6,242,951 | B1 | 6/2001 | Nakata et al. |
| 6,278,308 | B1 | 8/2001 | Partovi et al. |
| 6,323,701 | B1 | 11/2001 | Gradinariu et al. |
| RE37,552 | E | 2/2002 | Svensson et al. |
| 6,433,586 | B2 | 8/2002 | Ooishi |
| 6,438,422 | B1 | 8/2002 | Schu et al. |
| 6,477,658 | B1 | 11/2002 | Pang |
| 6,538,346 | B2 | 3/2003 | Pidutti et al. |
| 6,542,002 | B2 | 4/2003 | Jang et al. |
| 6,559,681 | B1 | 5/2003 | Wu et al. |
| 6,563,362 | B2 | 5/2003 | Lambert |
| 6,608,512 | B2 | 8/2003 | Ta et al. |
| 6,720,815 | B2 | 4/2004 | Mizuno |
| 6,742,132 | B2 | 5/2004 | Ziesler et al. |
| 6,777,992 | B2 | 8/2004 | Ziesler et al. |
| 6,856,171 | B1 | 2/2005 | Zhang |
| 6,879,190 | B2 | 4/2005 | Kim et al. |
| 6,882,182 | B1 | 4/2005 | Conn et al. |
| 7,005,893 | B1 | 2/2006 | Athas et al. |
| 7,145,408 | B2 | 12/2006 | Shepard et al. |
| 7,215,188 | B2 | 5/2007 | Ramaraju et al. |
| 7,227,425 | B2 * | 6/2007 | Jang et al. .......... 331/179 |
| 7,233,186 | B2 | 6/2007 | Ishimi |
| 7,301,385 | B2 | 11/2007 | Takano et al. |
| 7,307,486 | B2 | 12/2007 | Pernia et al. |
| 7,355,454 | B2 | 4/2008 | Papaefthymiou et al. |
| 7,622,977 | B2 | 11/2009 | Papaefthymiou et al. |
| 7,719,316 | B2 | 5/2010 | Chueh et al. |
| 7,719,317 | B2 | 5/2010 | Chueh et al. |
| 7,956,664 | B2 | 6/2011 | Chueh et al. |
| 7,973,565 | B2 | 7/2011 | Ishii et al. |
| 2001/0013795 | A1 | 8/2001 | Nojiri |
| 2002/0140487 | A1 | 10/2002 | Fayneh et al. |
| 2003/0189451 | A1 | 10/2003 | Ziesler et al. |
| 2005/0057286 | A1 | 3/2005 | Shepard et al. |
| 2005/0114820 | A1 | 5/2005 | Restle |
| 2006/0082387 | A1 | 4/2006 | Papaefthymiou et al. |
| 2006/0152293 | A1 | 7/2006 | McCorquodale et al. |
| 2007/0096957 | A1 | 5/2007 | Papaefthymiou et al. |
| 2007/0168786 | A1 | 7/2007 | Drake et al. |
| 2007/0216462 | A1 | 9/2007 | Ishimi |
| 2008/0136479 | A1 | 6/2008 | You et al. |
| 2008/0150605 | A1 | 6/2008 | Chueh et al. |
| 2008/0150606 | A1 | 6/2008 | Kumata |
| 2008/0164921 | A1 | 7/2008 | Shin |
| 2008/0303576 | A1 | 12/2008 | Chueh et al. |
| 2009/0027085 | A1 | 1/2009 | Ishii et al. |
| 2011/0084736 | A1 | 4/2011 | Papaefthymiou et al. |
| 2011/0084772 | A1 | 4/2011 | Papaefthymiou et al. |
| 2011/0084773 | A1 | 4/2011 | Papaefthymiou et al. |
| 2011/0084774 | A1 | 4/2011 | Papaefthymiou et al. |
| 2011/0084775 | A1 | 4/2011 | Papaefthymiou et al. |
| 2011/0090018 | A1 | 4/2011 | Papaefthymiou et al. |
| 2011/0090019 | A1 | 4/2011 | Papaefthymiou et al. |
| 2011/0109361 | A1 | 5/2011 | Nishio |
| 2011/0140753 | A1 | 6/2011 | Papaefthymiou et al. |
| 2011/0210761 | A1 | 9/2011 | Ishii et al. |
| 2011/0215854 | A1 | 9/2011 | Chueh et al. |

FOREIGN PATENT DOCUMENTS

| | | |
|---|---|---|
| EP | 1764669 | 3/2007 |
| JP | 63246865 | 10/1988 |
| JP | 7321640 | 12/1995 |
| JP | 3756285 | 1/2006 |
| WO | 2005092042 | 10/2005 |

OTHER PUBLICATIONS

Athas et al., "Low-Power Digital Systems Based on Adiabatic-Switching Principles," IEEE Transactions on Very Large Scale Integration (VLSI) Systems, vol. 2, No. 4, pp. 398-407, Dec. 1994.

Chan et al., "1.1 to 1.6GHz Distributed Differential Oscillator Global Clock Network," International Solid-State Circuits Conference, pp. 518-519, Feb. 9, 2005.

Chan et al., "A 4.6GHz Resonant Global Clock Distribution Network," IEEE International Solid-State Circuits Conference, Feb. 18, 2004.

Chan et al., "A Resonant Global Clock Distribution for the Cell Broadband Engine Processor," IEEE Journal of Solid State Circuits, vol. 44, No. 1, pp. 64-72, Jan. 2009.

Chan et al., "Design of Resonant Global Clock Distributions," Proceedings of the 21st International Conference on Computer Design, pp. 248-253, Oct. 2003.

Chueh et al., "900MHz to 1.2GHz Two-Phase Resonant Clock Network with Programmable Driver and Loading," IEEE Custom Integrated Circuits Conference, pp. 777-780, Sep. 2006.

Chueh et al., "Two-Phase Resonant Clock Distribution," Proceedings of the IEEE Computer Society Annual Symposium on VLSI: New Frontiers on VLSI Design, May 2005.

Cooke et al., "Energy Recovery Clocking Scheme and Flip-Flops for Ultra Low-Energy Application," International Symposium on Low-Power Electronic Design, pp. 54-59, Aug. 25-27, 2003.

Drake et al., "Resonant Clocking Using Distributed Parasitic Capacitance," IEEE Journal of Solid-State Circuits, vol. 39, No. 9, pp. 1520-1528, Sep. 2004.

Dunning, Jim, "An All-Digital Phase-Locked Loop with 50-Cycle Lock Time Suitable for High-Performance Microprocessors," IEEE Journal of Solid-State Circuits, vol. 30, No. 4, pp. 412-422, Apr. 1995.

Fang et al., "A High-Performance Asynchronous FPGA: Test Results," Proceedings of the 13th Annual IEEE Symposium on Field-Programmable Custom Computing Machines, Apr. 2005.

Favalli et al., "Testing Scheme for IC's Clocks," IEEE European Design and Test Conference, Mar. 1997.

Gutnik et al., "Active GHz Clock Network Using Distributed PLLs," IEEE Journal of Solid-State Circuits, vol. 35, No. 11, pp. 1553-1560, Nov. 2000.

Ishii et al., "A Resonant-Clock 200MHz ARM926EJ-S(TM) Microcontroller," European Solid-State Circuits Conference, Sep. 2009.

Kim et al., "Energy Recovering Static Memory," Proceedings of the 2002 International Symposium on Low Power Electronics and Design, pp. 92-97, Aug. 12-14, 2002.

Maksimovic et al., "Design and Experimental Verification of a CMOS Adiabatic Logic with Single-Phase Power-Clock Supply," Proceedings of the 40th Midwest Symposium on Circuits and Systems, pp. 417-420, Aug. 1997.

Maksimovic et al., "Integrated Power Clock Generators for Low Energy Logic," IEEE Annual Power Electronics Specialists Conference, vol. 1, pp. 61-67, Jun. 18-22, 1995.

Moon et al., "An Efficient Charge Recovery Logic Circuit," IEEE Journal of Solid-State Circuits, vol. 31, No. 4, pp. 514-522, Apr. 1996.

Sathe et al., "A 0.8-1.2GHz Frequency Tunable Single-Phase Resonant-Clocked FIR Filter with Level-Sensitive Latches," IEEE 2007 Custom Integrated Circuits Conference, pp. 583-586, Sep. 2007.

Sathe et al., "A 1.1GHz Charge-Recovery Logic," IEEE International Solid-State Circuits Conference, Feb. 7, 2006.

Sathe et al., "A 1GHz Filter with Distributed Resonant Clock Generator," IEEE Symposium on VLSI Circuits, pp. 44-45, Jun. 2007.

Sathe et al., "Resonant-Clock Latch-Based Design," IEEE Journal of Solid-State Circuits, vol. 43, No. 4, pp. 864-873, Apr. 2008.

Teifel et al., "Highly Pipelined Asynchronous FPGAs," Proceedings of the 2004 ACM/SIGDA 12th International Symposium on Field Programmable Gate Arrays, pp. 133-142, Feb. 22-24, 2004.

Weste et al., "Principles of CMOS VLSI Design: A Systems Perspective," 2nd Edition, Addison-Wesley, pp. 9-11, 1992.

Ziesler et al., "A 225 MHz Resonant Clocked ASIC Chip," Proceedings of the 2003 International Symposium on Low Power Electronics and Design, pp. 48-53, Aug. 25-27, 2003.

Ziesler et al., "A Resonant Clock Generator for Single-Phase Adiabatic Systems," Proceedings of the 2001 International Symposium on Low Power Electronics and Design, pp. 159-164, Aug. 6-7, 2001.

Ziesler et al., "Energy Recovering ASIC Design," Proceedings of the IEEE Computer Society Annual Symposium on VLSI, Feb. 20-21, 2003.

Search Report and Written Opinion from International Serial No. PCT/US2007/086304 mailed Mar. 3, 2009.

Search Report and Written Opinion from International Serial No. PCT/US2008/064766 mailed Dec. 22, 2008.

Search Report and Written Opinion from International Serial No. PCT/US2010/052390 mailed Jun. 23, 2011.

Search Report and Written Opinion from International Serial No. PCT/US2010/052393 mailed Jun. 23, 2011.

Search Report and Written Opinion from International Serial No. PCT/US2010/052395 mailed Jun. 23, 2011.

Search Report and Written Opinion from International Serial No. PCT/US2010/052397 mailed Jun. 23, 2011.

Search Report and Written Opinion from International Serial No. PCT/US2010/052401 mailed Jun. 29, 2011.

Search Report and Written Opinion from International Serial No. PCT/US2010/052402 mailed Jun. 23, 2011.

Search Report and Written Opinion from International Serial No. PCT/US2010/052405 mailed Jun. 23, 2011.

Search Report from International Serial No. PCT/US2003/010320 mailed Sep. 29, 2003.

Supplementary European Search Report from European Serial No. 03716979.4 mailed Jun. 7, 2006.

Taskin, Baris et al., "Timing-Driven Physical Design for VLSI Circuits Using Resonant Rotary Clocking," 49th IEEE International Midwest Symposium on Circuits and Systems, pp. 261-265, Aug. 6, 2006.

* cited by examiner

ARCHITECTURE FOR ADJUSTING NATURAL FREQUENCY IN RESONANT CLOCK DISTRIBUTION NETWORKS

CLAIM OF PRIORITY AND RELATED APPLICATIONS

This patent application is a conversion of and claims priority to U.S. Provisional Patent Application No. 61/250,830, entitled SYSTEMS AND METHODS FOR RESONANT CLOCKING INTEGRATED CIRCUITS, filed Oct. 12, 2009, which is incorporated herein in its entirety. This patent application is related to the technologies described in the following patents and applications, all of which are incorporated herein in their entireties:

U.S. patent application Ser. No. 12/125,009, entitled RESONANT CLOCK AND INTERCONNECT ARCHITECTURE FOR DIGITAL DEVICES WITH MULTIPLE CLOCK NETWORKS, filed Oct. 12, 2009, which claims priority to U.S. Provisional Patent Application No. 60/931,582, entitled RESONANT CLOCK AND INTERCONNECT ARCHITECTURE FOR PROGRAMMABLE LOGIC DEVICES, filed May 23, 2007;

U.S. patent application Ser. No. 12/903,154, entitled RESONANT CLOCK DISTRIBUTION NETWORK ARCHITECTURE WITH PROGRAMMABLE DRIVERS, filed Oct. 12, 2010;

U.S. patent application Ser. No. 12/903,158, entitled ARCHITECTURE FOR CONTROLLING CLOCK CHARACTERISTICS, filed Oct. 12, 2010;

U.S. patent application Ser. No. 12/903,163, entitled METHOD FOR SELECTING NATURAL FREQUENCY IN RESONANT CLOCK DISTRIBUTION NETWORKS WITH NO INDUCTOR OVERHEAD, filed Oct. 12, 2010;

U.S. patent application Ser. No. 12/903,168, entitled ARCHITECTURE FOR FREQUENCY-SCALED OPERATION IN RESONANT CLOCK DISTRIBUTION NETWORKS, filed Oct. 12, 2010;

U.S. patent application Ser. No. 12/903,172, entitled ARCHITECTURE FOR SINGLE-STEPPING IN RESONANT CLOCK DISTRIBUTION NETWORKS, filed Oct. 12, 2010;

U.S. patent application Ser. No. 12/903,174, entitled ARCHITECTURE FOR OPERATING RESONANT CLOCK NETWORK IN CONVENTIONAL MODE, filed Oct. 12, 2010; and U.S. patent application Ser. No. 12/903,188, entitled RESONANT CLOCK DISTRIBUTION NETWORK ARCHITECTURE FOR TRACKING PARAMETER VARIATIONS IN CONVENTIONAL CLOCK DISTRIBUTION NETWORKS filed Oct. 12, 2010.

FIELD OF INVENTION

This disclosure relates generally to clock distribution network architectures for digital devices with multiple clock networks and various clock frequencies such as microprocessors, application-specific integrated circuits (ASICs), and System-on-a-Chip (SOC) devices.

BACKGROUND OF THE INVENTION

Resonant clock distribution networks have been proposed for the energy-efficient distribution of clock signals in synchronous digital systems. In these networks, energy-efficient operation is achieved using one or more inductors to resonate the parasitic capacitance of the clock distribution network. Clock distribution with extremely low jitter is achieved through the reduction in the number of clock buffers. Moreover, extremely low skew is achieved among the distributed clock signals through the design of relatively symmetric all-metal distribution networks. Overall network performance depends on operating speed and total network inductance, resistance, size, and topology, with lower-resistance symmetric networks resulting in lower jitter, skew, and energy consumption when designed with adequate inductance.

In practice, digital devices are often specified and designed to operate at multiple clock frequencies. For example, a high-performance microprocessor may be designed to operate at multiple clock frequencies ranging from 100 MHz to 3 GHz. The technique of operating a clock signal at different clock frequencies over time is commonly referred to as frequency scaling and is motivated by the need to reduce power consumption in semiconductor devices. Power consumption in digital semiconductor devices grows in proportion with the rate at which these devices switch between their digital values. When performance requirements decrease, this rate can be reduced by reducing the frequency of the clock signal, thereby reducing power consumption.

The operation of clock signals at more than a single frequency also arises in the context of device binning, that is, the practice of selling at a premium a device that, due to manufacturing variations, is capable of operating at a higher peak clock frequency than another device of identical design and functionality. For example, a batch of microprocessors that was fabricated on a "fast" semiconductor manufacturing corner may contain microprocessors capable of running at clock frequencies of up to 3 GHz, while an identical-in-design batch of microprocessors that was fabricated on a "typical" semiconductor manufacturing corner may contain microprocessors that can run at clock frequencies of at most 2 GHz. While of identical design, the microprocessors in the first "fast" batch can be sold at significantly higher prices, due to their better achieved performance.

The challenge with the deployment of resonant clock distribution networks in multi-frequency operation contexts is that these networks typically achieve their highest energy efficiency for a relatively narrow range of clock frequencies centered around the natural frequency of the resonant network. For clock frequencies outside this narrow range, energy efficiency degrades significantly, and to an extent that outweighs the inherent energy advantages of resonant clocking. For example, consider a microprocessor that has been designed with a target frequency of 3 GHz, but its digital logic can only achieve a peak clock rate of 2 GHz after manufacturing. In a non-resonant clock implementation of the microprocessor, the clock network can be operated at 2 GHz, consuming power in proportion to its 2 GHz operating frequency. In a resonant clock design, however, if the resonant clock network operates at 2 GHz, instead of its natural frequency of 3 GHz, its power consumption will significantly exceed the power consumption of the non-resonant design at 2 GHz.

In addition to excessive power consumption, when a resonant clock network operates away from its natural frequency, the shape of the clock waveform is increasingly deformed, as the mismatch between the natural and the operating frequency increases. In extreme situations, the peak clock frequency after manufacturing may be so far from the natural frequency of the resonant clock network that the clock waveform at the peak clock frequency becomes deformed to such an extent that incorrect operation of the clocked elements results, and the function of the overall device becomes incorrect.

It is possible to address the above challenges in a number of straightforward yet impractical ways. One such approach is to enable the adjustment of the natural frequency by providing for the selective introduction of capacitance to the resonant clock network. Since the energy efficiency of the resonant clock network decreases as its capacitance increases, adjusting the natural frequency by introducing capacitance compromises power savings at lower operating frequencies. Moreover, the area overhead of the spare capacitance may be prohibitively high.

Another approach to the adjustment of the natural frequency is the deployment of series or parallel combinations of multiple distinct inductors that can be selectively engaged. In general, however, the use of multiple distinct inductors results in potentially prohibitive area overheads.

Architectures for resonant clock distribution networks have been described and empirically evaluated in several articles, including "A 225 MHz Resonant Clocked ASIC Chip," by Ziesler C., et al., *International Symposium on Low-Power Electronic Design*, August 2003; "Energy Recovery Clocking Scheme and Flip-Flops for Ultra Low-Energy Applications," by Cooke, M., et al., *International Symposium on Low-Power Electronic Design*, August 2003; and "Resonant Clocking Using Distributed Parasitic Capacitance," by Drake, A., et al., *Journal of Solid-State Circuits*, Vol. 39, No. 9, September 2004; "900 MHz to 1.2 GHz two-phase resonant clock network with programmable driver and loading," by Chueh J.-Y., et al., *IEEE 2006 Custom Integrated Circuits Conference*, September 2006; "A 0.8-1.2 GHz frequency tunable single-phase resonant-clocked FIR filter," by Sathe V., et al., *IEEE 2007 Custom Integrated Circuits Conference*, September 2007; "A Resonant Global Clock Distribution for the Cell Broadband Engine Processor," by Chan S., et al., *IEEE Journal of Solid State Circuits*, Vol. 44, No. 1, January 2009. In all these articles, the resonant clock distribution networks are restricted to a single natural frequency. No attempt is made and no methods are proposed for adjusting the natural frequency of the resonant clock networks in a way that addresses the aforementioned challenges.

Overall, the examples herein of some prior or related systems and their associated limitations are intended to be illustrative and not exclusive. Other limitations of existing or prior systems will become apparent to those of skill in the art upon reading the following Detailed Description.

SUMMARY OF THE DESCRIPTION

A resonant clock distribution network architecture is described herein that allows for the adjustment of the natural frequency of a resonant clock distribution network, so that it achieves energy-efficient operation at multiple clock frequencies. The architecture described herein is primarily targeted at the design of resonant clock distribution networks with integrated inductors and exhibits relatively low area overheads. Such an architecture is generally applicable to semiconductor devices with multiple clock frequencies, low-power clocking requirements, and high-performance, for example, microprocessors, ASICs, and SOCs. Moreover, it is applicable to the binning of semiconductor devices according to achievable performance levels.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Other advantages and features will become apparent from the following description and claims. It should be understood that the description and specific examples are intended for purposes of illustration only and not intended to limit the scope of the present disclosure.

BRIEF DESCRIPTION OF DRAWINGS

These and other objects, features and characteristics of the present invention will become more apparent to those skilled in the art from a study of the following detailed description in conjunction with the appended claims and drawings, all of which form a part of this specification. In the drawings:

Figure 1:
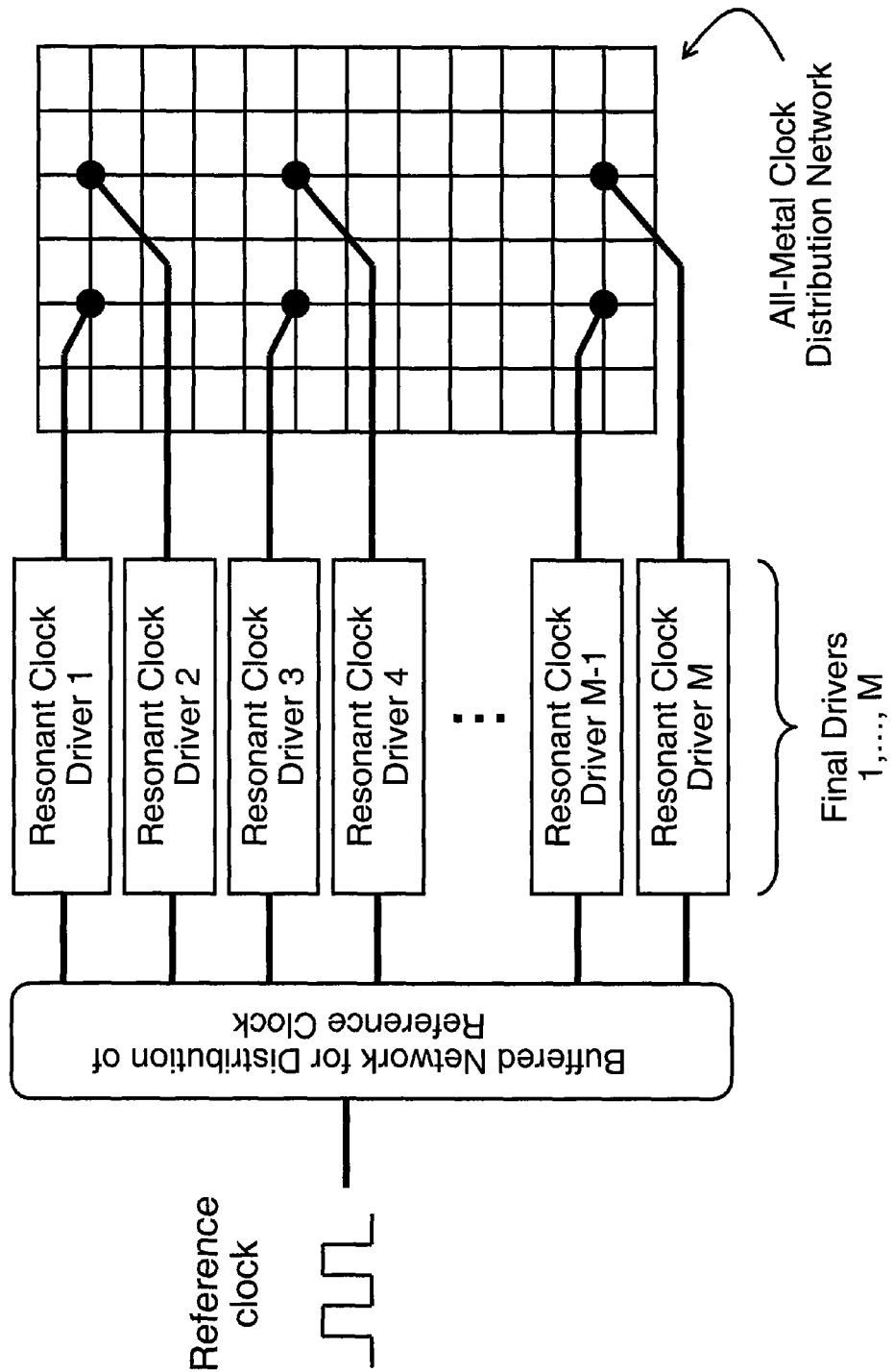
FIG. 1 shows a typical architecture of a resonant clock distribution network.

The headings provided herein are for convenience only and do not necessarily affect the scope or meaning of the claimed invention.

In the drawings, the same reference numbers and any acronyms identify elements or acts with the same or similar structure or functionality for ease of understanding and convenience. To easily identify the discussion of any particular element or act, the most significant digit or digits in a reference number refer to the Figure number in which that element is first introduced (e.g., element 204 is first introduced and discussed with respect to FIG. 2).

DETAILED DESCRIPTION OF THE INVENTION

Various examples of the invention will now be described. The following description provides specific details for a thorough understanding and enabling description of these examples. One skilled in the relevant art will understand, however, that the invention may be practiced without many of these details. Likewise, one skilled in the relevant art will also understand that the invention can include many other obvious features not described in detail herein. Additionally, some well-known structures or functions may not be shown or described in detail below, so as to avoid unnecessarily obscuring the relevant description.

The terminology used below is to be interpreted in its broadest reasonable manner, even though it is being used in conjunction with a detailed description of certain specific examples of the invention. Indeed, certain terms may even be emphasized below; however, any terminology intended to be interpreted in any restricted manner will be overtly and specifically defined as such in this Detailed Description section.

FIG. 1 shows a typical resonant clock distribution network architecture for a semiconductor device. In this network, a buffered distribution network is used to distribute a reference clock signal to multiple resonant clock drivers that are in turn used to drive the clock signal across an all-metal clock distribution network. Typically, this all-metal network has an approximately symmetric topology, delivering the clock signal to the clocked elements (for example, flip-flops and clock gaters) of the semiconductor device with very low skew. Each resonant clock driver incorporates an inductor that is used to provide additional drive strength with low energy consumption by resonating the parasitic capacitance of the load seen by the driver.

Figure 2:
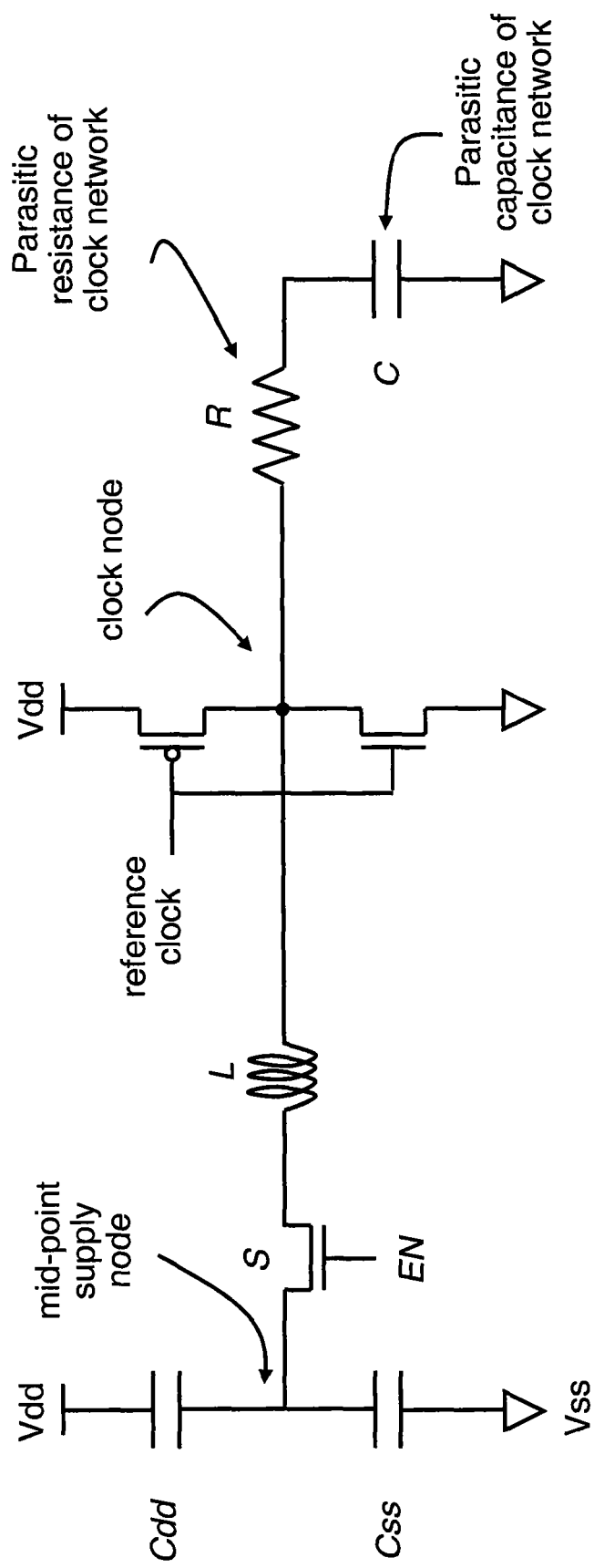
FIG. 2 shows a typical driver design for resonant clocking with the clock load modeled as a lumped capacitor.

FIG. 2 shows a typical resonant clock driver design, in which the part of the overall clock distribution network serviced by the resonant clock driver is modeled as a lumped capacitor C in series with a lumped resistance R. This driver comprises a pull-up PMOS and a pull-down NMOS device for driving the clock. The PMOS device is connected between the clock node and the power supply terminal. The NMOS device is connected between the clock node and the ground terminal. Both devices are driven by the reference clock signal. An inductor L is connected between the clock node and a supply node with voltage at approximately the mid-point of the clock signal oscillation. For example, if the clock signal oscillates between 0V and 1V, the mid-point supply voltage is approximately 0.5V. In the driver of this figure, the mid-point is implemented using two capacitors Cdd and Css. Capacitor Cdd is connected between the mid-point and the power supply terminal. Capacitor Css is connected between the mid-point and the ground terminal. To maximize energy savings, the value of the inductor is approximately chosen so that the LC tank set-up by the inductor and the parasitic capacitance of the clock distribution network has a natural frequency that is approximately equal to the frequency of the reference clock signal. The switch S can be used to selectively decouple the inductor from the mid-point supply, thus providing the option of driving the clock network in conventional (i.e., non-resonant) mode. When the control signal EN turns the switch on, the driver operates in resonant mode. When the switch is turned off, then the driver operates in conventional mode. In this figure, the switch is shown conceptually as a single NMOS transistor. In general, this switch will be typically implemented as a transmission gate that incorporates both NMOS and PMOS transistors.

The energy efficiency of the resonant clock driver depends on various design and operating parameters. The quality factor Q of the resonant system is an indicator of its energy efficiency. This factor is proportional to $(L/C)^{1/2}/R$. In general, energy efficiency decreases as R increases, due to the $I^2R$ losses associated with the flow of the current/that charges and discharges the parasitic clock load C through the resistance R. Also, for a fixed natural frequency, energy efficiency decreases as capacitance C increases, since the current flowing through resistance R increases.

The mismatch between the natural frequency of the resonant LC-tank system and the frequency of the reference clock signal is another important factor that affects the energy efficiency of the resonant clock network. As the frequency of the reference clock that drives the resonant clock driver moves further away from the natural frequency of the resonant clock driver's LC-tank, energy efficiency decreases. When the mismatch between the two frequencies becomes too large, the energy consumption of the resonant clock driver becomes excessive and impractically high. Moreover, the shape of the clock waveform becomes so distorted that it cannot be reliably used to clock flip-flops or other clocked elements. Consequently, resonant clock drivers tend to have a narrower range of clock frequencies within which they operate efficiently than the range of clock frequencies typically supported by a semiconductor device that uses frequency scaling. In practice, to support the broad range of operating frequencies used in a frequency-scaled semiconductor device, it is desirable for the LC-tank of the resonant clock driver to be capable of operating at more than one natural frequency.

Figure 3:
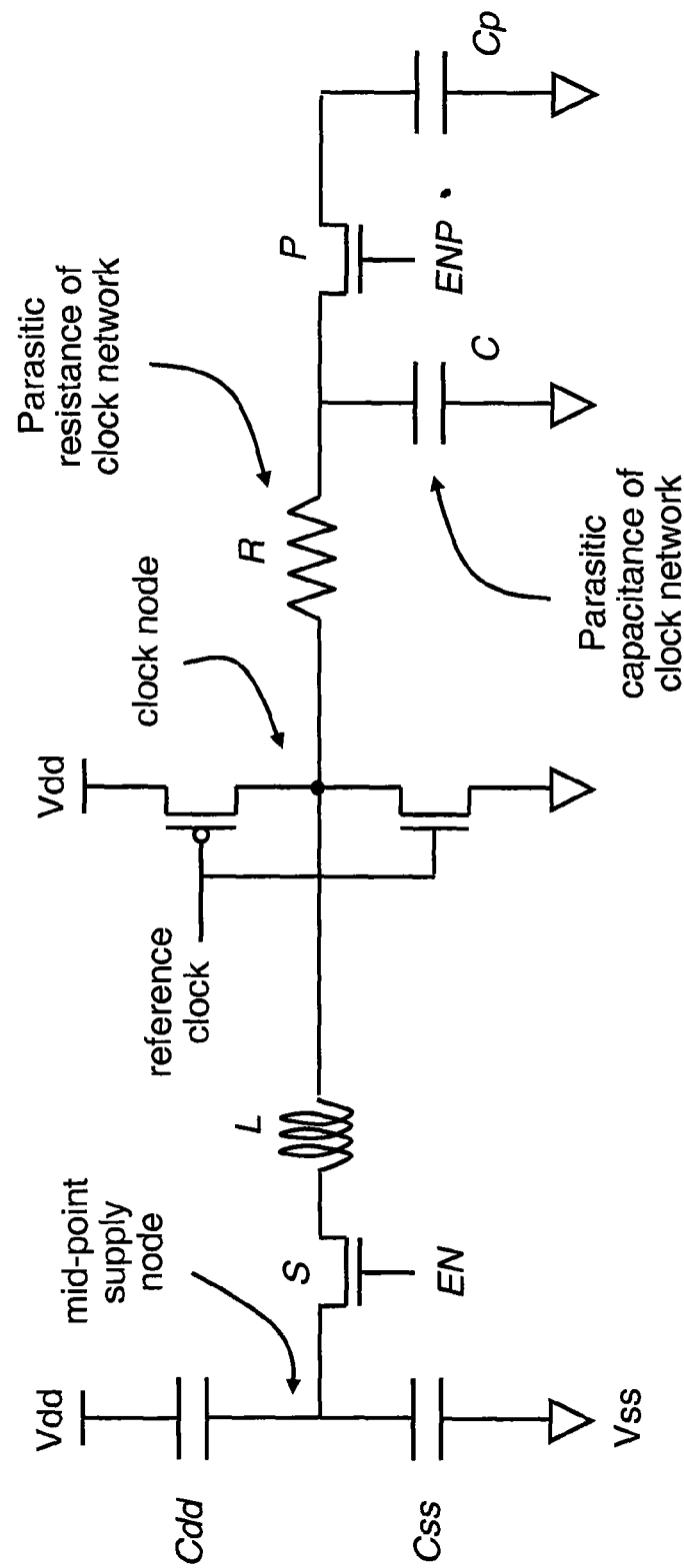
FIG. 3 shows an approach to adjusting natural frequency by selective introduction of capacitance in parallel to the clock load.

FIG. 3 shows a possible approach for supporting a second natural frequency through selective introduction of capacitance in parallel to the clock load. A switch P is used to selectively connect capacitor Cp in parallel to the parasitic capacitance C of the clock network. When switch P is turned off by control signal ENP, the total capacitance seen at the clock node is C, and the natural frequency f1 of the resonant clock network is proportional to $1/(L\,C)^{1/2}$. When switch P is turned on, the total capacitance seen at the clock node increases to C+Cp, resulting in a lower natural frequency f2, which is proportional to $1/(L(C+Cp))^{1/2}$. The main drawback of this approach is that due to the additional capacitance Cp and the resistance introduced by switch P, operation at f2 has a lower Q factor than at f1, thus resulting in decreased relative energy savings. Another drawback of this approach is that the implementation of capacitance Cp using an integrated capacitor results in significant area overheads. For example, to obtain $f2=f1^{1/2}$, capacitance Cp must be approximately equal to the capacitance C of the clock distribution network.

Figure 4:
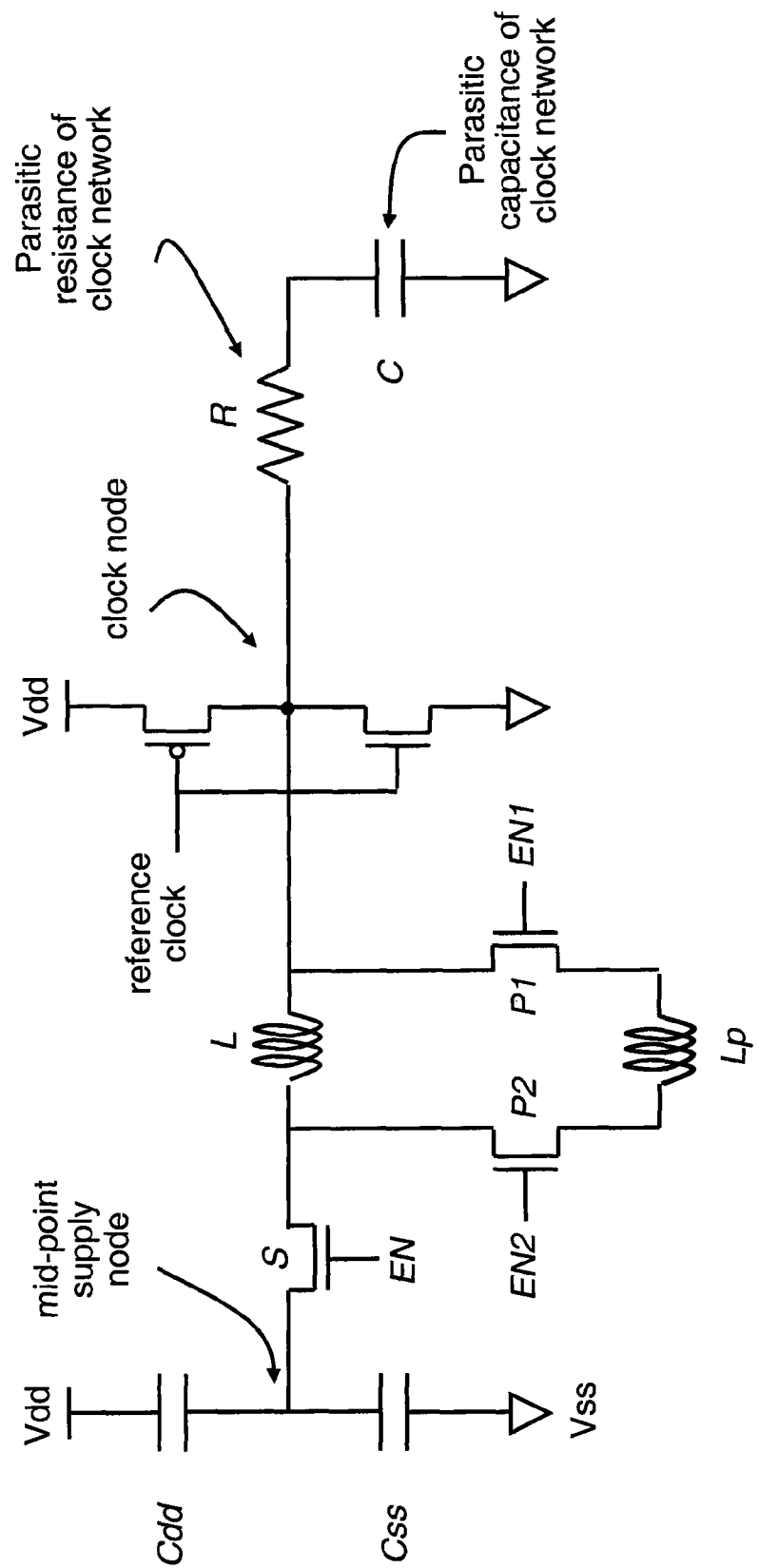
FIG. 4 shows an approach to adjusting natural frequency by selective introduction of inductance in parallel to the original inductor.

FIG. 4 shows another possible approach for supporting a second natural frequency in a resonant clock driver. In this approach, an inductor Lp is selectively introduced in parallel to the original L of the resonant clock driver using a pair of switches P1 and P2. When the two switches are turned off, the total inductance in the resonant clock network is L, and the natural frequency f1 of the resonant clock network is proportional to $1/(L\,C)^{1/2}$. When the two switches are turned on, the total inductance decreases to $L\,Lp/(L+Lp)$, resulting in a higher natural frequency f2, which is proportional to $1/((L+Lp)C)^{1/2}$. The main drawback of this approach is that due to the decrease in total inductance, and the additional resistance introduced by switches P1 and P2, operation at f2 has a lower Q factor than at f1, thus resulting in decreased relative energy savings. For clock networks operating at GHz frequencies, this decrease in energy savings is exacerbated by the fact that total resistance at the higher operating frequency f2 will be higher than at f1, due to skin effect. Another drawback of this approach is that inductance Lp must be implemented using an inductor in parallel to L, generally resulting in significant area overheads. For example, to obtain $f2=f^{1/2}$, inductance Lp must be approximately equal to the original inductance L in the resonant clock driver.

Figure 5:
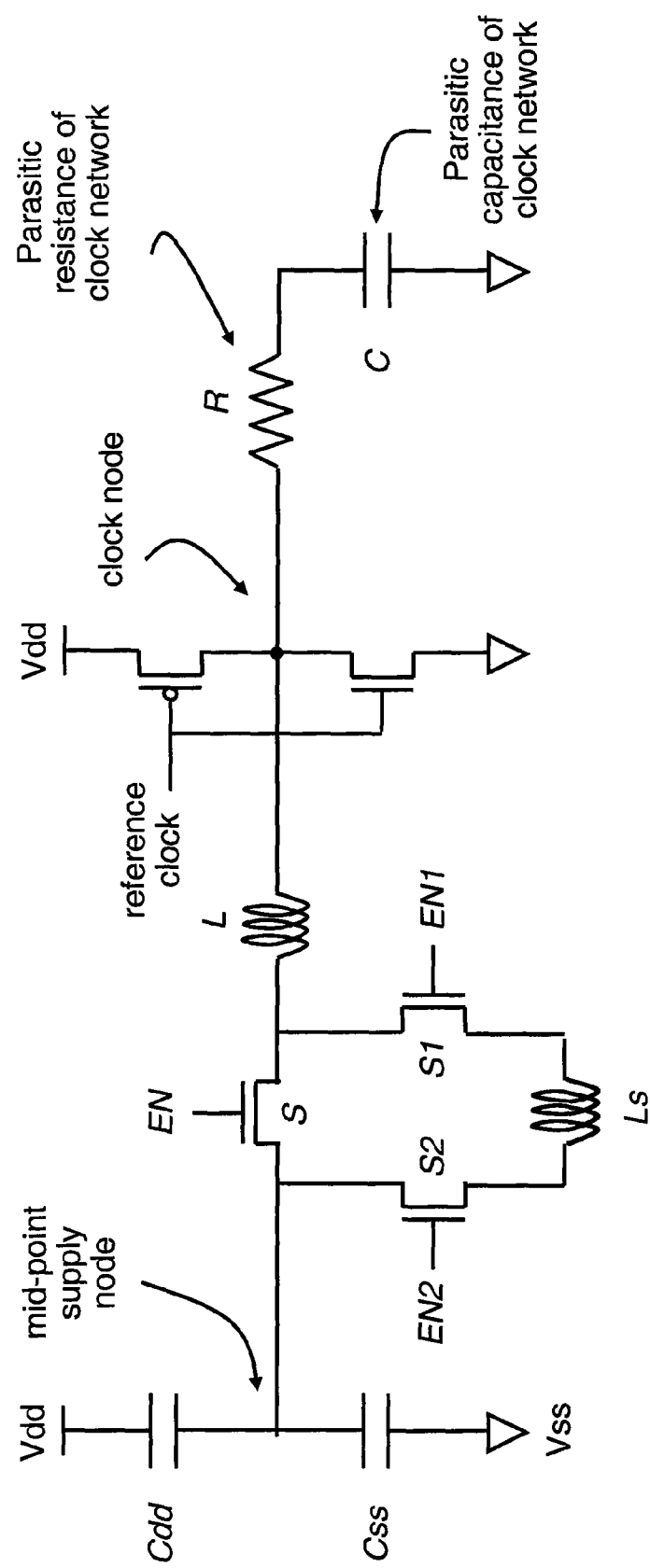
FIG. 5 shows an embodiment of the proposed approach for adjusting natural frequency by selective introduction of inductance in series to the original inductor.

FIG. 5 shows an embodiment of the proposed approach for adjusting a resonant clock driver so that it has two natural frequencies by selective introduction of series inductance to the resonant clock network. This embodiment uses three switches S, S1, and S2 to selectively connect an additional inductor Ls in series to the original inductor L. (In this figure, switches S, S1, and S2 are shown as NMOS devices. Alternatively, these switches can be implemented as transmission gates. Other alternative embodiments that use both NMOS and PMOS devices are also possible.) Switch S is connected in series with the inductor L. (In this figure, switch S is connected between the inductor and the mid-point node. Alternatively, switch S can be connected between the inductor and the clock node.) Switches S1 and S2 are used to connect an inductive element Ls in parallel to switch S. By appropriate selection of the switch control signals EN, EN1, and EN2, the inductive element Ls can be selectively introduced in series to inductor L. Specifically, when switch S is turned on, and switches S1 and S2 are turned off, the total inductance of the resonant system is L, yielding a natural frequency f1 proportional to $1/(LC)^{1/2}$. When switch S is turned off, and switches S1 and S2 are turned on, the total inductance of the resonant clock network is L+Ls, yielding a lower natural frequency f2 proportional to $1/((L+Ls)C)^{1/2}$. An advantage of the proposed approach is that at the lower natural frequency f2, the energy efficiency is comparable with that achieved at natural frequency f1. Specifically, the increase in series resistance, due to the deployment of two switches rather than one, is offset by the increase in inductance. For example, if all switches have resistance R, and Ls=3 L, the Q factor at f2 equals the Q factor at f1.

Figure 6:
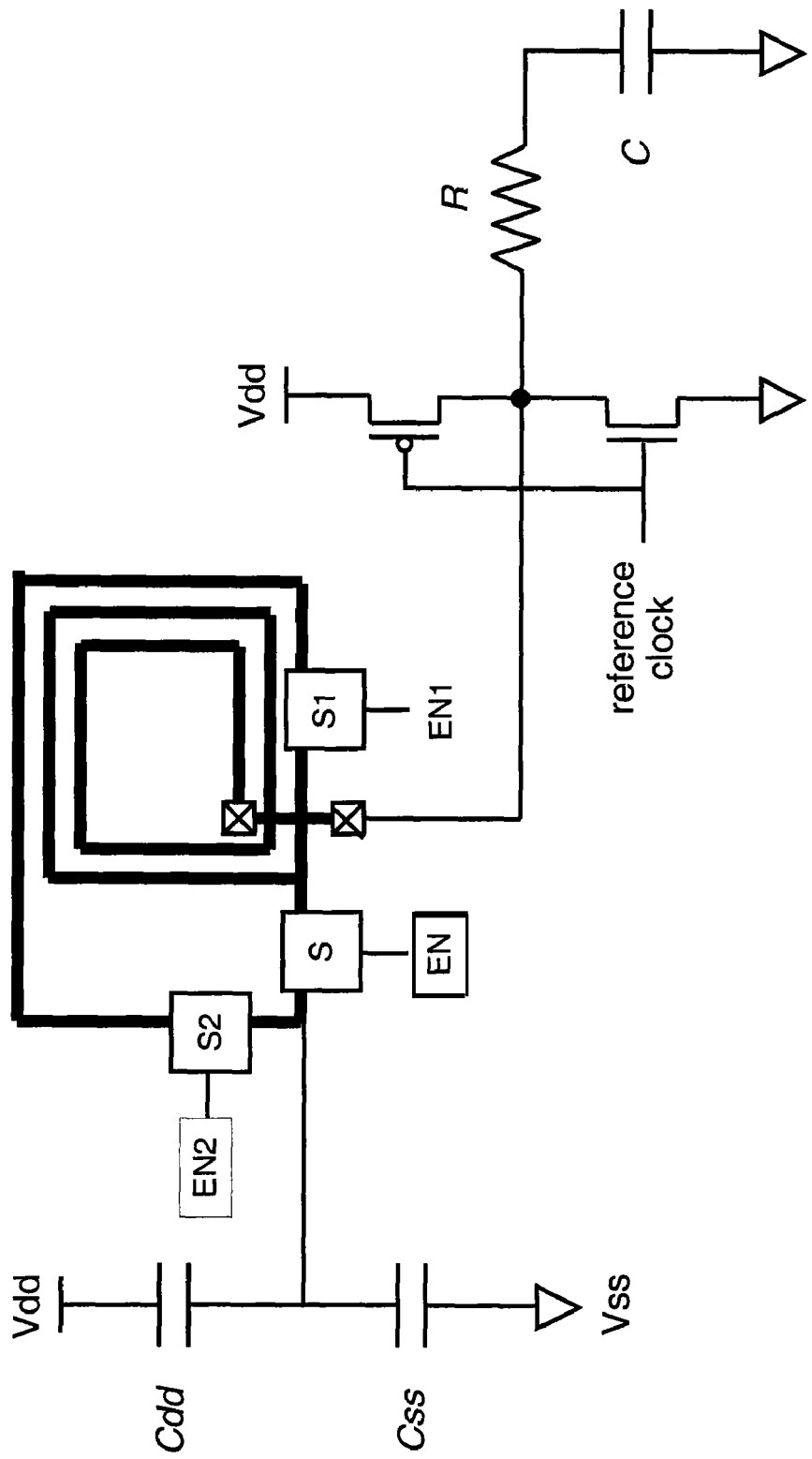
FIG. 6 shows an embodiment of the proposed inductor architecture for adjusting natural frequency in the context of integrated inductors.

Another advantage of the proposed approach is its relatively low overhead in an integrated implementation. FIG. 6 shows an embodiment of the proposed approach using integrated inductors. In this embodiment, the two inductors L and Ls are formed as concentric spirals. In this figure, inductor L is a 2-turn spiral. (In general, it will be a spiral with m turns.) Inductor Ls is a 3-turn spiral that is implementing by selectively connecting L with an additional outside turn. (In general, it will be a spiral with m+n turns, formed by selectively connecting n outside turns.) To a first order approximation, the inductance of the 3-turn spiral is approximately 9/4≈2 times larger than that of the 2-turn spiral. Therefore, f1 is approximately √2 times greater than f2. Notice that in this embodiment, the series inductance was formed in a low-overhead manner by introducing an additional turn to the original 2-turn inductor. By incrementally adding on to the substantial existing structure of the original inductor in the resonant clock driver, the proposed approach can be implemented with relatively low area overhead.

Attempting to reduced area overheads in the parallel inductor approach shown in FIG. 4, by adding turns to the inductor as shown in FIG. 6, has significantly lower efficacy, because the placement of the turns of one inductor co-axially with a second inductor will generally increase the inductance of each inductor, relative to its inductance if isolated from the other inductor. As a consequence the reduction in area overhead has effects on inductance that are contrary to the reduction of overall inductance that is the goal of the parallel inductors.

Figure 7:
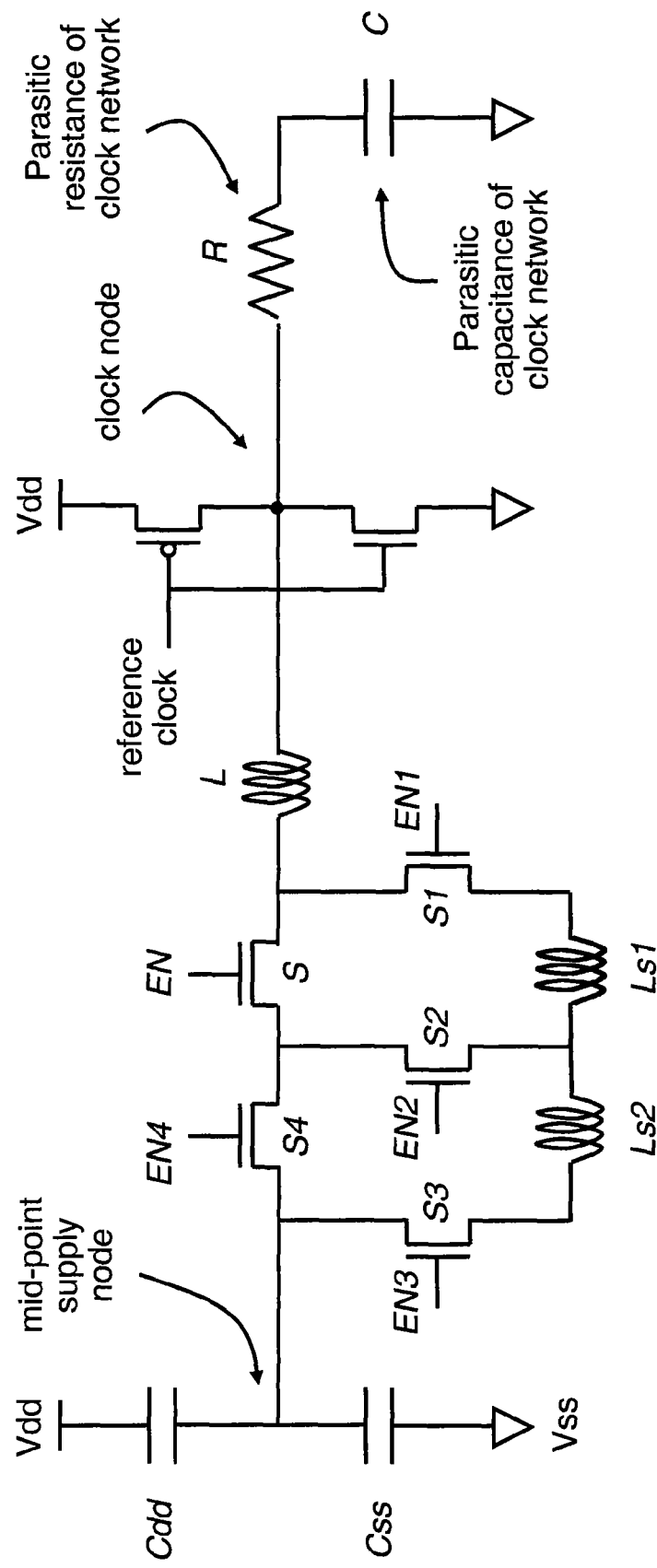
FIG. 7 shows an embodiment of the proposed inductor architecture for resonant clock drivers with three natural frequencies.
Figure 8:
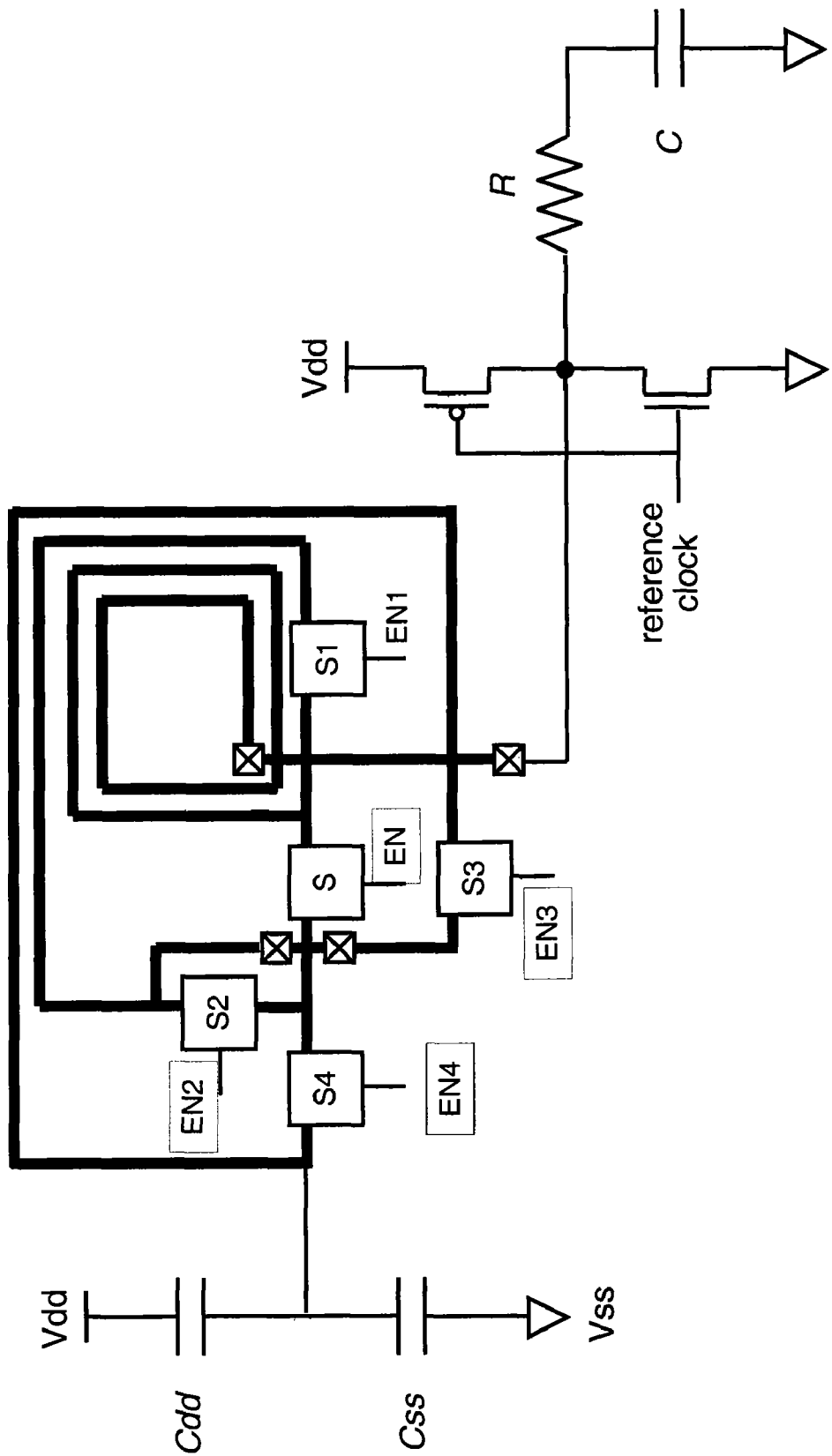
FIG. 8 shows an embodiment of the proposed inductor architecture for resonant clock drivers with three natural frequencies and integrated inductors.

The proposed approach can be extended in a straightforward manner to yield resonant clock drivers with multiple natural frequencies by including additional inductors that can be selectively connected in series to the original one in the resonant clock network. FIG. 7 shows an embodiment that supports three natural frequencies using five switches S, S1, S2, S3, S4 to selectively connect inductor Ls1 or inductor Ls1+Ls2 in series to the original inductor L. (In this figure, these switches are shown as NMOS devices. Alternatively, these switches can be implemented as transmission gates. Other alternative embodiments that use both NMOS and PMOS devices are also possible.) FIG. 8 shows an embodiment of this proposed approach using three concentric spiral inductors.

Unless the context clearly requires otherwise, throughout the description and the claims, the words "comprise," "comprising," and the like are to be construed in an inclusive sense (i.e., to say, in the sense of "including, but not limited to"), as opposed to an exclusive or exhaustive sense. As used herein, the terms "connected," "coupled," or any variant thereof means any connection or coupling, either direct or indirect, between two or more elements. Such a coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the invention is not intended to be exhaustive or to limit the invention to the precise form disclosed above. While specific examples for the invention are described above for illustrative purposes, various equivalent modifications are possible within the scope of the invention, as those skilled in the relevant art will recognize. While processes or blocks are presented in a given order in this application, alternative implementations may perform routines having steps performed in a different order, or employ systems having blocks in a different order. Some processes or blocks may be deleted, moved, added, subdivided, combined, and/or modified to provide alternative or sub-combinations. Also, while processes or blocks are at times shown as being performed in series, these processes or blocks may instead be performed or implemented in parallel, or may be performed at different times. Further any specific numbers noted herein are only examples. It is understood that alternative implementations may employ differing values or ranges.

The various illustrations and teachings provided herein can also be applied to systems other than the system described above. The elements and acts of the various examples described above can be combined to provide further implementations of the invention.

Any patents and applications and other references noted above, including any that may be listed in accompanying filing papers, are incorporated herein by reference. Aspects of the invention can be modified, if necessary, to employ the systems, functions, and concepts included in such references to provide further implementations of the invention.

These and other changes can be made to the invention in light of the above Detailed Description. While the above description describes certain examples of the invention, and describes the best mode contemplated, no matter how detailed the above appears in text, the invention can be practiced in many ways. Details of the system may vary considerably in its specific implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

While certain aspects of the invention are presented below in certain claim forms, the applicant contemplates the various aspects of the invention in any number of claim forms. For example, while only one aspect of the invention is recited as a means-plus-function claim under 35 U.S.C. §112, sixth paragraph, other aspects may likewise be embodied as a means-plus-function claim, or in other forms, such as being embodied in a computer-readable medium. (Any claims intended to be treated under 35 U.S.C. §112, ¶6 will begin with the words "means for.") Accordingly, the applicant reserves the right to add additional claims after filing the application to pursue such additional claim forms for other aspects of the invention.

We claim:

1. A resonant clock driver of a clock distribution network, the resonant clock driver comprising:
    a first inductive resonance element electrically coupled to a clock node of the resonant clock driver via a first switch, wherein, upon being enabled via selection of the first switch, the first inductive resonance element is configured to cause the resonant clock driver to resonate at a first frequency corresponding to an inductance value of the first inductive resonance element;
    a second inductive resonance element electrically coupled to the clock node via a second switch, wherein, upon being enabled by selection of the second switch, the second inductive resonance element is connected in series with the first inductive resonance element causing the resonant clock driver to resonate at a second frequency corresponding to a sum of inductance values of the first inductive resonance element and the second inductive resonance element; and
    one or more drive elements electrically coupled to the clock node, the one or more drive elements configured to receive and propagate a reference clock of the clock distribution network.

2. The resonant clock driver of claim 1, wherein, upon being selected, the first inductive resonance element and/or the second inductive resonance element are electrically connected to a mid-point supply node.

3. The resonant clock driver of claim 1, wherein the first inductive resonance element and the second inductive resonance element are physically laid out as concentric spiral elements.

4. The resonant clock driver of claim 1, wherein each of the one or more drive elements are configured to receive an enable signal, the enable signal of a given drive element causing the given drive element to receive and propagate the reference clock.

5. The resonant clock driver of claim 4, wherein an overall drive strength of the resonant clock driver at a given instant is a function of a number of the one or more drive elements enabled at the given instant.

6. The resonant clock driver of claim 1, wherein each of the one or more drive elements includes a pull-up drive element and a pull-down drive element.

7. The resonant clock driver of claim 6, wherein each of the pull-up drive elements receives a first duty-adjusted version of the reference clock, and wherein each of the pull-down drive elements receives a second duty-adjusted version of the reference clock.

8. A method of operating a resonant clock driver at multiple frequencies, the method comprising:
    electrically coupling a plurality of inductive resonance elements to the resonant clock driver, each of the plurality of inductive resonance elements configured to be selectively connected for operation in the resonant clock driver, wherein each of the plurality of inductive elements enables the resonant clock driver to resonate at a particular frequency;
    selecting, for operation in the resonant clock driver, one or more of the plurality of inductive resonance elements, wherein, a selection of more than one of the plurality of inductive resonance elements causes a corresponding subplurality of inductive resonance elements to be connected in series, causing the resonant clock driver to resonate at an overall frequency that is a function of a sum of inductance values of the selected one or more inductive resonance elements; and
    electrically coupling one or more drive elements to the resonant clock network, the one or more drive elements configured to receive and propagate a reference clock of the clock distribution network.

9. The method of claim 8, wherein the plurality of inductive resonance elements are physically laid out as concentric spiral elements.

10. The method of claim 8, further comprising receiving, by each of the one or more drive elements, an enable signal, the enable signal of a given drive element causing the given drive element to receive and propagate the reference clock.

11. The method of claim 10, wherein an overall drive strength of the resonant clock driver at a given instant is a function of a number of the one or more drive elements enabled at the given instant.

12. The method of claim 8, wherein each of the one or more drive elements includes a pull-up drive element and a pull-down drive element.

13. The method of claim 12, wherein each of the pull-up drive elements receives a first duty-adjusted version of the reference clock, and wherein each of the pull-down drive elements receives a second duty-adjusted version of the reference clock.

* * * * *